United States Patent [19]
Bennett et al.

[11] Patent Number: 5,902,836
[45] Date of Patent: May 11, 1999

[54] ACRYLIC SYRUP CURABLE TO A CROSSLINKED VISCOELASTOMERIC MATERIAL

[75] Inventors: Greggory S. Bennett, Hudson, Wis.; Gaddam N. Babu, Woodbury, Minn.; Kejian Chen, Woodbury, Minn.; Louis E. Winslow, Stillwater, Minn.; George F. Vesley, Hudson, Wis.; Patrick G. Zimmerman, St. Paul, Minn.

[73] Assignee: Minnesota Mining and Manufacturing Company, St. Paul, Minn.

[21] Appl. No.: 08/505,350

[22] PCT Filed: Jul. 28, 1995

[86] PCT No.: PCT/US95/09601

§ 371 Date: Aug. 23, 1995

§ 102(e) Date: Aug. 23, 1996

[87] PCT Pub. No.: WO96/04346

PCT Pub. Date: Feb. 15, 1996

Related U.S. Application Data

[63] Continuation-in-part of application No. 08/282,058, Jul. 29, 1994, abandoned.

[51] Int. Cl.$^6$ .......................... C08J 133/08; C08J 133/10; C08F 2/50
[52] U.S. Cl. .................................. 522/8; 522/34; 522/35; 522/114; 522/121; 522/125; 522/182; 522/904; 526/328; 526/328.5
[58] Field of Search .................................. 522/904, 905, 522/35, 182, 114, 121, 125, 8, 34; 526/328.5, 328

[56] References Cited

U.S. PATENT DOCUMENTS

| | | | |
|---|---|---|---|
| Re. 24,906 | 12/1960 | Ulrich | 206/59 |
| 3,565,247 | 2/1971 | Brochman | 206/59 |
| 3,575,925 | 4/1971 | Skoultchi | 260/47 |
| 3,615,972 | 10/1971 | Morehouse, Jr. et al. | 156/79 |
| 3,993,833 | 11/1976 | Esmay | 428/311 |
| 4,075,238 | 2/1978 | Mark et al. | 260/458 |
| 4,144,157 | 3/1979 | Guse et al. | 204/159.23 |
| 4,181,752 | 1/1980 | Martens et al. | 427/54.1 |
| 4,181,755 | 1/1980 | Liu et al. | 430/314 |
| 4,223,067 | 9/1980 | Levens | 428/308 |
| 4,243,500 | 1/1981 | Glennon | 204/159.12 |
| 4,287,308 | 9/1981 | Nakayama et al. | 521/53 |
| 4,303,485 | 12/1981 | Levens | 204/159.24 |
| 4,329,384 | 5/1982 | Vesley et al. | 428/40 |
| 4,330,590 | 5/1982 | Vesley | 428/336 |
| 4,364,972 | 12/1982 | Moon | 427/54.1 |
| 4,379,201 | 4/1983 | Heilmann | 428/345 |
| 4,391,687 | 7/1983 | Vesley | 204/159.16 |
| 4,415,615 | 11/1983 | Esmay et al. | 428/40 |
| 4,710,536 | 12/1987 | Klingen et al. | 524/493 |
| 4,732,808 | 3/1988 | Krampe et al. | 428/355 |
| 4,737,559 | 4/1988 | Kellen et al. | 526/291 |
| 4,749,590 | 6/1988 | Klingen et al. | 427/54.1 |
| 4,818,610 | 4/1989 | Zimmerman | 428/345 |
| 4,894,259 | 1/1990 | Kuller | 427/208.8 |
| 4,895,738 | 1/1990 | Zimmerman et al. | 427/208.8 |
| 4,914,004 | 4/1990 | Köhler et al. | 430/272 |
| 4,922,004 | 5/1990 | Köhler et al. | 560/221 |
| 4,977,293 | 12/1990 | Hatton et al. | 558/153 |
| 5,026,806 | 6/1991 | Rehmer et al. | 526/316 |
| 5,073,611 | 12/1991 | Rehmer et al. | 526/208 |
| 5,128,386 | 7/1992 | Rehmer et al. | 522/35 |
| 5,180,756 | 1/1993 | Rehmer et al. | 522/35 |
| 5,202,361 | 4/1993 | Zimmerman et al. | 522/120 |
| 5,248,805 | 9/1993 | Boettcher et al. | 558/270 |
| 5,264,533 | 11/1993 | Rehmer et al. | 526/301 |
| 5,302,629 | 4/1994 | Berejka | 523/111 |
| 5,334,447 | 8/1994 | Kitamura et al. | 428/317.3 |
| 5,506,279 | 4/1996 | Babu et al. | 522/34 |

FOREIGN PATENT DOCUMENTS

| | | |
|---|---|---|
| 675420 | 5/1966 | Belgium . |
| 0 281 941 | 9/1988 | European Pat. Off. . |
| 0 373 662 | 6/1990 | European Pat. Off. . |
| 0 395 987 | 11/1990 | European Pat. Off. . |
| 43 03 183 | 7/1994 | Germany . |
| 58-046236 | 3/1983 | Japan . |
| 61-083273 | 4/1986 | Japan . |
| 2-235908 | 9/1990 | Japan . |
| 2-248482 | 10/1990 | Japan . |
| 03035075 | 2/1991 | Japan . |
| 3-250031 | 11/1991 | Japan . |
| 6-166858 | 6/1994 | Japan . |
| 6-172729 | 6/1994 | Japan . |
| 6-200225 | 7/1994 | Japan . |
| WO 93/09152 | 5/1993 | WIPO . |
| 93/20164 | 10/1993 | WIPO . |
| WO 94/14853 | 12/1993 | WIPO . |
| 94/13750 | 6/1994 | WIPO . |

OTHER PUBLICATIONS

Aucher, G. et al., "Developing UV–Crosslinkable Acrylic Hot Melt PSAs," *Adhesives Age*, pp. 20–25, (Jul. 1994).
M. Koehler et al., "Coreactive Photoinitiators", pp. 1–5, 1989.

*Primary Examiner*—Susan W. Berman
*Attorney, Agent, or Firm*—Harold C. Knecht, III

[57] ABSTRACT

Solute polymers in solvent monomers form a coatable syrup that can be cured to a viscoelastomeric material when radiation-sensitive α-cleaving groups in either the polymer or one of the monomers are exposed to ultraviolet radiation. The solute polymers can be formed from the solvent monomers in situ or be added thereto to form the syrup.

18 Claims, No Drawings

ACRYLIC SYRUP CURABLE TO A CROSSLINKED VISCOELASTOMERIC MATERIAL

This application is a Continuation-in-Part of U.S. Ser. No. 08/282,058 filed Jul. 29, 1994, now abandoned.

BACKGROUND OF THE INVENTION

1. Field of the Invention

This invention describes a viscoelastomeric material with high shear at ambient and elevated temperatures prepared from a blend of ethylenically unsaturated monomers. A process for making this material is also described.

2. Background Information

Pressure sensitive adhesives (PSAs) made by photopolymerizing an alkyl acrylate and a polar copolymerizable monomer are known in the art. See, e.g., U.S. Pat. Nos. RE 24,906; 4,181,755; 4,364,972; and 4,243,500. Acrylic-based PSAs exhibit good adherence to high energy (i.e., polar) substrates such as metal and painted steel surfaces but generally exhibit lower adhesion to low energy (i.e., nonpolar) substrates such as polyethylene and polypropylene.

Solvent-processed acrylic PSA compositions can be crosslinked by adding a polyfunctional crosslinking agent that reacts with a reactive group present in the polymer. See, e.g., Japanese Kokoku 58[1983]-046236 in which is described a solvent-processed crosslinked acrylic PSA with excellent cohesion that is the reaction product of (a) a polyisocyanate, prepared by reacting (1) an acrylic copolymer having a molecular weight between 1,000 and 30,000 and from 1.7 to 5.0 functional groups that can react with an isocyanate group with (2) a diisocyanate, so that the ratio of isocyanate groups per coreactive functional group is about 2:1, and (b) an adherent copolymer comprising functional groups that can react with an isocyanate group. Like any solvent processing technique, however, the preparation of thick adhesives is difficult because the solvent causes bubbling in the adhesive and the emission of solvent vapors into the atmosphere is undesirable.

To avoid environmental pollution, manufacturing processes that do not require the use of volatile solvents have become of great interest. An early step in this direction for the manufacture of PSA tape was the process described in Belgium Patent No. 675,420. In this process, flexible carriers are coated with acrylic monomers, or mixtures of such monomers with copolymerizable compounds, with the possible addition of a thickening and/or initiating agent, and the monomers are polymerized directly on the carrier using ultraviolet radiation.

Hot melt coating a PSA composition eliminates the necessity of solvent processing. To hot melt process an adhesive composition, the composition must be uncrosslinked during the coating process; however, to achieve a PSA with balanced properties (i.e., peel and shear adhesion), the composition must be crosslinked. In hot melt coating processes, this is usually done by exposure to high energy radiation (e.g., E-beam or high intensity ultraviolet radiation). When high intensity ultraviolet radiation is used, a photoactive crosslinking species such as benzophenone is generally added to the composition. However, this often results in PSAs that display cure gradients. Additionally, thicker sections of PSA compositions cannot be cured this way.

A more efficient method of photocrosslinking involves incorporating hydrogen abstracting moieties into the polymer backbone prior to coating. Such polymers can be hot melt coated and subsequently cured by conventional irradiation techniques. This process is typified by U.S. Pat. No. 4,737,599 where a PSA with good adhesion to skin is described. That process is much more efficient than the high intensity irradiation method described immediately above, but the preparation of a thick PSA section that does not display a cure gradient is not described.

The cohesive strength of an acrylic PSA can be increased without unduly affecting its compliance by utilizing a photoactive crosslinking agent in conjunction with a photoinitiator. See, e.g., U.S. Pat. Nos. 4,181,752; 4,329,384; 4,330,590; 4,391,687, and 5,202,361. Useful photoactive crosslinking agents include various aldehydes, quinones, and particularly certain chromophore-substituted halomethyl-s-triazines (because they provide desirably shortened reaction times and somewhat greater tolerance to oxygen over the non-halomethyl-containing agents), although their use can result in evolution of HCl during polymerization.

An ultraviolet (UV) radiation-curable composition that includes 20 to 99% (by wt.) of a copolymer of ethylenically unsaturated monomers, 1 to 80% (by wt.) ethylenically unsaturated monomers, and 0 to 20% (by wt.) of one or more polyethylenically unsaturated compounds is described in U.S. Pat. No. 5,180,756.

Copolymerizable photoinitiators such as 2-[4-(2-hydroxy-2,2-dimethyl-1-oxopropyl)phenoxy]ethyl 2-propenoate and their use in the polymerization of ethylenically unsaturated compounds is disclosed in U.S. Pat. No. 4,922,004.

Japanese Kokai 2[1990]-248482 describes a photocurable PSA obtained by reacting (a) 30 to 50 parts by weight (pbw) of a copolymer of an acrylic acid alkyl ester, a copolymerizable ethylenically unsaturated monomer having a polar group, and a copolymerizable monomer with a photosensitizing group (such as 2-acryloyloxybenzophenone or 1-acryloyloxy-2-[4-(4-chlorobenzoyl)benzoyloxy]ethane); (b) 40 to 60 pbw of an aryloxy acrylic monomer such as phenoxyethyl acrylate or nonylphenoxyethyl acrylate; and (c) a tackifying resin. The composition is cured using a total dose of energy of 300 to 800 mJ/cm$^2$ from a high pressure mercury lamp. Such high intensity ultraviolet radiation is likely to produce an adhesive that has a shear value less than 100 minutes.

Similarly, DE 42 03 183 C1 (Germany) discloses a method for producing PSA layers comprising the steps of thickening a monomer mixture that includes a photoinitiator with a separately made, solvent-free saturated UV-reactive polyacrylate; coating the thickened mixture onto a substrate; and irradiating the coated substrate. The separately made polymer comprises side chains that, when irradiated, participate in crosslinking reactions. The sole example involves the addition of a commercially available polymer having a molecular weight of about 200,000 to a monomer mixture that is then polymerized.

The shear values of PSAs prepared by actinically irradiating acrylic monomers can be enhanced by the addition of polyacrylic crosslinking agents. See, e.g., U.S. Pat. No. 4,379,201. Such PSAs involve networks and are sensitive to processing conditions.

A composition that can be radiation cured to provide thick, high molecular weight PSA compositions with outstanding properties has not been previously described.

SUMMARY OF THE INVENTION

Briefly, the present invention provides a syrup, preferably a syrup of a coatable viscosity, curable to a crosslinked viscoelastomeric material comprising:

a) about 85 to 99.9 weight percent, preferably about 90 to 99.9 weight percent of a solvent monomer mixture comprising 95 to 100 pbw, preferably 97 to 100 pbw, of at least one free radically-polymerizable ethylenically unsaturated monomer and 0 to 5 pbw, preferably 0 to 3 pbw, of an ethylenically unsaturated monomer comprising a radiation-sensitive α-cleaving group;

b) about 0.1 to 15 weight percent, preferably about 0.1 to 10 weight percent, of a solute polymer, preferably a polymer having a molecular weight of at least 500,000, comprising about 95 to 100 weight percent mer units derived from one or more free radically-polymerizable ethylenically unsaturated monomers and about 0 to 5 weight percent mer units derived from an ethylenically unsaturated monomer comprising a radiation-sensitive α-cleaving group, with the proviso that the weight percent of the second component of the polymer cannot be zero when the monomer mixture comprises zero parts by weight of the ethylenically unsaturated monomer comprising a radiation-sensitive α-cleaving group;

c) from 0 to 5 pbw, preferably 0.01 to 0.30 pbw, of a free radically-polymerizable polyethylenically unsaturated monomer; and d) from 0 to 3 pbw, preferably 0.001 to 1.0 pbw of a saturated energy-activated initiator of polymerization (i.e., an energy-activated initiator of polymerization that is free of ethylenic unsaturation).

In another aspect, the present invention provides a process for making a crosslinked viscoelastomeric material comprising the steps:

a) providing a composition comprising a solvent monomer mixture comprising at least one free radically-polymerizable ethylenically unsaturated monomer and 0 to 5 pbw, preferably 0 to 3 pbw, of an ethylenically unsaturated monomer comprising a radiation-sensitive α-cleaving group and 0 to 3 pbw, preferably 0.001 to 0.5 pbw, of a saturated energy-activated initiator of polymerization, preferably a saturated radiation-activated initiator of polymerization, with the proviso that the amount of saturated initiator must be greater than zero when the amount of ethylenically unsaturated monomer comprising a radiation-sensitive α-cleaving group is zero;

b) exposing the composition to energy, preferably radiative energy, so as to partially polymerize the monomer mixture and form a coatable syrup;

c) adding to the syrup, based on the total amount of monomer initially present in said monomer mixture, 0 to 3 pbw, preferably 0.001 to 0.5 pbw, of a saturated energy-activated initiator of polymerization, preferably a saturated radiation-activated initiator of polymerization; 0 to 3 pbw of an ethylenically unsaturated monomer comprising a radiation-sensitive α-cleaving group, with the proviso that the amount of ethylenically unsaturated monomer comprising a radiation-sensitive α-cleaving group added to the syrup must be greater than zero when the amount of ethylenically unsaturated monomer comprising a radiation-sensitive α-cleaving group in the monomer mixture is zero; and/or 0 to 5 pbw, preferably 0.01 to 0.30 pbw, of a polyethylenically unsaturated monomer; and d) exposing the syrup to energy that activates the initiator and the radiation-sensitive α-cleaving group so as to form the crosslinked viscoelastomeric material.

The viscoelastomeric material produced from the above syrup is also described. The syrup optionally can be coated on a substrate prior to being irradiated, and such articles are also described.

The coatable syrup of the present invention is polymerizable to a viscoelastomeric material that can be crosslinked directly. The viscoelastomeric material is preferably a PSA having high shear at both ambient and elevated temperatures. This syrup comprises a solute polymer in a solvent monomer mixture. The polymer preferably has a very high molecular weight, preferably at least 500,000, more preferably at least 750,000, even more preferably at least 1,000,000, most preferably at least 1,500,000. One or both of the polymer and monomer contains at least one radiation-sensitive α-cleaving group that, upon exposure to UV radiation, is activated to enable curing. The cured product is a viscoelastomeric material.

Where the polymer of the syrup of the present invention contains side chains that comprise radiation-sensitive α-cleaving groups activatable by UV radiation, free radicals are formed that allow for growth of the side chain by addition of ethylenically unsaturated monomer(s). These growing side chains become entangled with other such side chains, or react with other such side chains to produce a crosslinked viscoelastomeric material. Where the polymer does not include radiation-sensitive α-cleaving group-containing side chains, the monomer mixture contains enough ethylenically unsaturated monomer comprising a radiation-sensitive α-cleaving group to form, upon exposure to UV radiation, a polymer that includes radiation-sensitive α-cleaving groups in side chains. In this embodiment, the original polymer chains become entangled with the newly formed polymer chains to form a crosslinked network.

Where no ethylenically unsaturated monomer comprising a radiation-sensitive α-cleaving group is present in the initial monomer mixture, some polymer that includes side chains comprising the aforementioned radiation-sensitive α-cleaving groups or some monomer that contains a radiation-sensitive α-cleaving group must be added to the syrup prior to formation of the viscoelastomeric material therefrom (i.e., polymerization of the monomer(s) of the monomer mixture). Preferably, however, the solute polymer is prepared in situ, i.e., directly from the solvent monomer mixture. This eliminates the need for solubilizing a separately made polymer in a monomer mixture and allows very high molecular weight polymers to be formed and solubilized.

Viscoelastomeric materials produced from the syrup of the present invention can be used as PSAS, vibration damping materials, transfer adhesives, structural adhesives, protective coatings, and the like. Advantageously, the syrup of the present invention can have a coatable viscosity and can therefore be applied to a substrate prior to curing, thus allowing for the simple production of articles comprising one or more layers of the aforementioned viscoelastomeric material.

Unless otherwise indicated, the following definitions apply in this application:

"group" or "compound" or "monomer" or "polymer" means, unless otherwise noted, a chemical species that can be substituted by conventional substituents that do not interfere with the desired product; and "(meth)acrylic" refers to acrylate, methacrylate, acrylamide, and methacrylamide compounds, as well as alkyl and aryl compounds that have been substituted with an acrylate or methacrylate group.

DETAILED DESCRIPTION OF PREFERRED EMBODIMENTS

The syrup of the present invention comprises from about 85 to 99.9 weight percent, preferably from about 90 to 99.9 weight percent, of a solvent monomer mixture and from about 0.1 to 15 weight percent, preferably from about 0.1 to 10 weight percent, of a solute polymer.

In the syrup of the present invention, the solute polymers and the solvent monomer mixtures are based, in substantial part, on free radically-polymerizable ethylenically unsaturated monomers. Ethylenically unsaturated monomers that do not contain a radiation-sensitive α-cleaving group comprise from about 95 to 100 pbw, preferably 97 to 100 pbw, of the monomer mixture. From 95 to 100% (by wt.) of the mer units of the polymer are also derived from such monomers. Preferred free radically-polymerizable ethylenically unsaturated monomers are (meth)acrylic acid and its numerous well known derivatives.

Particularly preferred among such monomers are monoethylenically-unsaturated monomers that are homopolymerizable to a polymer with a glass transition temperature ($T_g$) less than about 0° C. (hereinafter "A monomers"). These monomers preferably constitute from about 50 to 100 pbw, more preferably from about 60 to 95 pbw, of the solvent monomer mixture of the syrup of the present invention. Common examples of A monomers include (meth) acrylic acid esters of monohydric alcohols. Preferred among these are monofunctional esters of non-tertiary alcohols, particularly primary alcohols. Those (meth)acrylic acid esters wherein the alkyl portion of the ester contains from 4 to about 12 carbon atoms have been found to be especially useful. Such monomers include, but are not limited to, isooctyl acrylate, butyl acrylate, hexyl acrylate, 2-ethylhexyl acrylate, isononyl acrylate, decyl acrylate, and dodecyl acrylate.

Monethylenically unsaturated monomers that are homopolymerizable to a polymer with a $T_g$ greater than about 50° C. (hereinafter "B monomers") can also be included in the free radically-polymerizable ethylenically unsaturated portion of the monomer mixture of the composition of the present invention. B monomers, when present, preferably constitute from about 0.1 to about 50 pbw, more preferably from about 5 to about 40 pbw of the monomer mixture. Examples of useful B monomers include, but are not limited to, (meth)acrylic acid, itaconic acid, substituted (meth)acrylamides such as N,N-dimethylacrylamide and N-octylacrylamide, N-vinyl pyrrolidone, N-vinyl caprolactam, acrylonitrile, tetrahydrofurfuryl acrylate, isobornyl acrylate, abitol acrylate, and dicyclopentadienyl acrylate.

Ethylenically unsaturated monomers that comprise a radiation-sensitive α-cleaving group and that are copolymerizable with the aforementioned free radically-polymerizable ethylenically unsaturated monomers (hereinafter "C monomers") constitute from 0 to about 5 pbw, preferably 0 to 3 pbw, of the solvent monomer mixture of the syrup of the present invention. Preferred C monomers include ethylenically unsaturated compounds having the general formula $$CH_2=C(R)-CX-[(M^1)_a-(M^2)_b-(M^3)_c]_m-G-Z$$

wherein

R is H or a $C_1$ to $C_3$ alkyl group, preferably H or a methyl group;

X is O or NH;

n is 0 or 1;

m is 0 or an integer from 1 to 5;

a, b, and c are independently 0 or 1;

$M^1$ is $CH_2$ or $SiR^1R^2$;

$M^2$ is $CR^3R^4$ or $SiR^1R^2$;

$M^3$ is O, NH, C(O), C(O)O, C(O)NH, or OC(O)NH;

$R^1$ and $R^2$ are independently H or a $C_1$ to $C_4$ alkyl group;

$R^3$ and $R^4$ are independently H, an alkyl group having 1 to 14 carbon atoms, a cycloalkyl group having 3 to 14 carbon atoms, an aryl group having 5 to 12 ring atoms, an arenyl group having 6 to 26 carbon and 0 to 3 S, N, and nonperoxidic O heteroatoms, or $R^3$ and $R^4$ taken together with the carbon to which they are attached form a carbocyclic ring containing 4 to 12 ring atoms;

G is a covalent bond, $(CH_2)_d$, or $(CH_2)_dO$ where d is an integer from 1 to 4, preferably from 1 to 2;

Z is a radiation-sensitive α-cleaving group having the formula $$-Ar-\underset{R^5}{\overset{O}{\underset{|}{C}}}-R^9$$

in which

Ar is a substituted arene having 6 to 12 carbon atoms, preferably a benzene group;

$R^5$ is hydrogen, a $C_1$ to $C_{12}$ alkyl group, a $C_1$ to $C_{12}$ alkoxy group, or a phenyl group; and $R^9$ is selected from the group consisting of $$-\underset{R^8}{\overset{R^6}{\underset{|}{C}}}-R^7$$

in which $R^4$ is hydrogen, a $C_1$ to $C_{12}$ alkyl group, a $C_1$ to $C_{12}$ alkoxy group, or a phenyl group, with the proviso that, when $R^5$ and $R^4$ are both ortho to the carbonyl group of Z, together they can be one of $$-O- \quad -\overset{O}{\underset{||}{C}}- \quad -S- \quad \text{and} \quad -CH_2-$$

and $R^6$, $R^7$, and $R^8$ are independently a hydroxyl group, a phenyl group, a $C_1$ to $C_6$ alkyl group, a $C_1$ to $C_6$ alkoxy group, or a $-NR^{10}R^{11}$ group, wherein $R^{10}$ and $R^{11}$ are independently hydrogen or a $C_1$ to $C_6$ alkyl group, with the proviso that, when $R^9$ is $CR^6R^7R^8$, one of the following must be true:

(1) at least one of $R^6$, $R^7$, and $R^8$ is selected from the class consisting of hydroxyl, alkoxy, and $-NR^{10}R^{11}$ groups;

(2) any two of $R^6$, $R^7$, and $R^8$ together are one of $-C_pH_{2p}-$ and $-OC_pH_{2p}O-$ wherein p is either 2 or 3 so that they, together with the carbon atoms to which they are attached, form a 5- or 6-membered ring; and (3) any two of $R^6$, $R^7$, and $R^8$ together are a carbonyl group, provided that the remaining one of $R^6$, $R^7$, and $R^8$ is selected from the class consisting of hydroxy, alkoxy, $-NR^{10}R^{11}$, and phenyl groups.

Preferably, where m is not 0, $M^1$ and $M^2$ are not both $SiR^1R^2$. Preferred α-cleaving type C monomers are those compounds described immediately above where $R^9$ is $$-\underset{R^8}{\overset{R^6}{\underset{|}{C}}}-R^7$$

and/or Ar (from Z) being a benzenetriyl group.

Particularly preferred C monomers include

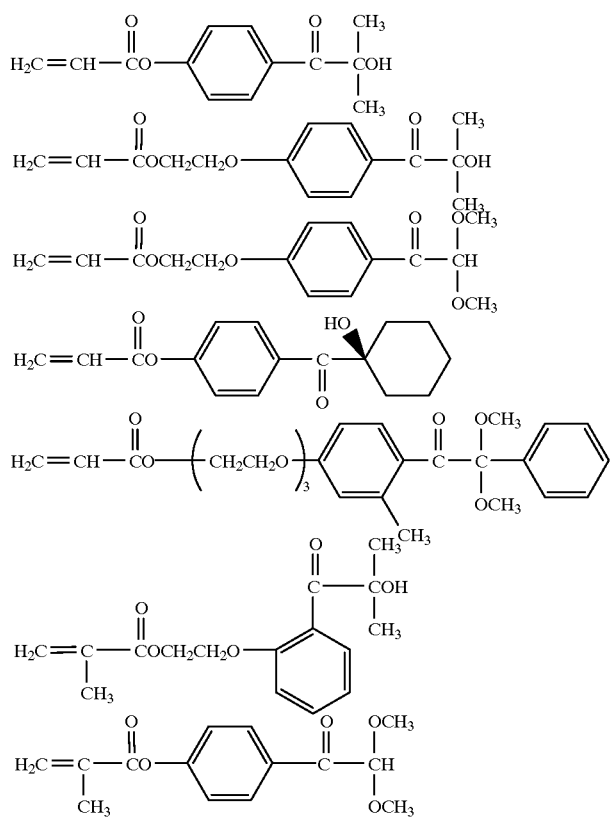

| | |
|---|---|
| | PIA #1 |
| | PIA #2 |
| | PIA #3 |
| | PIA #4 |
| | PIA #5 |
| | PIA #6 |
| | PIA #7 |

A variety of C monomers can be made by reacting an ethylenically unsaturated monomer comprising a first functional group (hereinafter "D compounds") with a compound that comprises a radiation-sensitive α-cleaving group and a second functional group (hereinafter "E compounds"), the two functional groups being coreactive with each other. Preferred D and E compounds are ethylenically unsaturated aliphatic, cycloaliphatic, and aromatic compounds having up to 36 carbon atoms, optionally one or more oxygen and/or nitrogen atoms, and at least one reactive functional group. When the first and second functional groups react, they form a covalent bond and link the D and E compounds.

Examples of useful functional groups include hydroxyl, secondary amino, azlactyl, oxazolinyl, acetyl acetonyl, carboxyl, isocyanato, epoxy, aziridinyl, acyl halide, vinyloxy, and cyclic anhydride groups. Preferred among these are isocyanato, hydroxyl, carboxyl, and vinyloxy groups. Where the D or E compound comprises an isocyanato group, the other preferably comprises a secondary amino or hydroxyl group; where the D or E compound comprises a hydroxyl group, the other preferably comprises a carboxyl, isocyanato, epoxy, anhydride, or azlactyl group; where the D or E compound comprises a carboxyl group, the other preferably comprises a hydroxyl, amino, epoxy, vinyloxy, or oxazolinyl group; and where the D or E compound comprises a vinyloxy group, the other preferably comprises a carboxyl group.

Representative examples of useful D compounds include hydroxyalkyl (meth)acrylates such as 2-hydroxyethyl (meth)acrylate and 2-(2-hydroxyethoxy)ethyl (meth)acrylate; aminoalkyl (meth)acrylates such as 3-aminopropyl (meth)acrylate and 4-aminostyrene; azlactyl-substituted compounds such as 2-ethenyl-1,3-oxazolin-5-one and 2-propenyl-4,4-dimethyl-1,3-oxazolin-5-one; carboxy-substituted compounds such as (meth)acrylic acid and 4-carboxybenzyl (meth)acrylate; isocyanato-substituted compounds such as isocyanatoethyl (meth)acrylate and 4-isocyanatocyclohexyl (meth)acrylate; epoxy-substituted compounds such as glycidyl (meth)acrylate; aziridinyl-substituted compounds such as N-acrylaziridine and 1-(2-propenyl)-aziridine; and acyl halides such as (meth)acryl chloride.

Representative examples of E compounds include functional group-substituted α-cleaving compounds such as 1-(4-hydroxyphenyl)-2,2-dimethoxyethanone, 1-[4-(2-hydroxyethyl)phenyl]-2,2-dimethoxyethanone, (4-isocyanatophenyl)-2,2-dimethoxy-2-phenylethanone, 1-{4-[2-(2,3-epoxypropoxy)phenyl]}-2,2-dimethyl-2-hydroxyethanone, 1-[4-(2-aminoethoxy)phenyl]-2,2-dimethoxyethanone, and 1-[4-(carbomethoxy)phenyl]-2,2-dimethoxyethanone.

If desired, a saturated energy-activated initiator of polymerization (i.e., a source of free radicals other than a C monomer) can be used in forming the polymer component of the syrup of the present invention from the monomer component. These energy-activated sources can be either heat- or UV radiation activated. Examples of heat-activated sources include benzoyl peroxide, t-butyl perbenzoate, cumene hydroperoxide, azobis(isobutyronitrile), and methyl ethyl ketoperoxide. Useful UV radiation-activated initiators include the benzoin ethers such as benzoin methyl ether and benzoin ispropyl ether; substituted acetophenones such as 2,2-diethoxyacetophenone available as Irgacure™ 651 photoinitiator (Ciba-Geigy Corp.; Ardsley, N.Y.), 2,2-dimethoxy-2-phenyl-1-phenylethanone commonly available as Esacure™ KB-1 photoinitiator, (Sartomer Co.; West Chester, Pa.), and dimethoxyhydroxyacetophenone; substituted α-ketols such as 2-methyl-2-hydroxy propiophenone; aromatic sulfonyl chlorides such as 2-naphthalenesulfonyl chloride; and photoactive oximes such as 1-phenyl-1,2-propanedione-2-(O-ethoxycarbonyl)oxime. Particularly preferred among these are the substituted acetophenones. A saturated energy-activated source of free radicals can be present in an amount from about 0 to 3 pbw, preferably from 0.001 to about 1.0 pbw, more preferably from 0.005 to 0.5 pbw, per 100 pbw of the solvent monomer mixture.

When present and upon activation through introduction of appropriate energy, the saturated energy-activated initiator of polymerization initiates polymerization of the free radically-polymerizable ethylenically unsaturated monomers (i.e., the A and B monomers). When ethylenically unsaturated monomers comprising a radiation-sensitive α-cleaving group (i.e., C monomers) are also present, they also can be incorporated into the backbone chain of the polymer, resulting in radiation-sensitive α-cleaving groups pendent from the backbone chain.

Where a saturated heat-activated initiator is used with a monomer mixture that includes at least one C monomer, the syrup can be exposed to heat only or to heat and UV-radiation so as to initiate polymerization of the monomer mixture.

Where a saturated UV radiation-activated initiator is used with a monomer mixture that includes at least one C monomer, the saturated photoinitiator can have an absorption spectrum with an onset of absorption ($\lambda_A$) that is at least 25 nm apart from the onset of absorption of the radiation-sensitive α-cleaving group of the C monomer ($\lambda_B$). This allows for crosslinking, through activation of the α-cleaving group, to occur after the saturated photoinitiator has initiated polymerization.

Inclusion of unsaturated hydrogen abstracting monomers and/or polyunsaturated monomers will provide a polymer with pendent groups that include hydrogen abstracting or unsaturated groups, respectively. Those groups can then be activated by means known in the art to allow for further polymerization, normally after the monomer-polymer composition (i.e., syrup) has been coated onto a substrate.

One or more free radically-polymerizable polyethylenically unsaturated monomers can be included in the monomer mixture or, preferably, added to the syrup. Use of such monomer(s) allows for a reduction in the amount of ethylenically unsaturated monomer comprising a radiation-sensitive α-cleaving group necessary to produce the viscoelastomeric material of the present invention. Examples of polyethylenically unsaturated monomers that can be used include, but are not limited to, polyacrylic-functional monomers such as ethylene glycol diacrylate, propylene glycol dimethacrylate, trimethylolpropane triacrylate, 1,6-hexamethylenedioldiacrylate, pentaerythritol di-, tri-, and tetraacrylate, and 1,12-dodecanedioldiacrylate; olefinic-acrylic-functional monomers such as allyl methacrylate, 2-allyloxycarbonylamidoethyl methacrylate, and 2-allylaminoethyl acrylate; allyl 2-acrylamido-2,2-dimethylacetate; divinylbenzene; and the like.

If desired, microspheres can be added to the syrup of the present invention. When microspheres are used, the resultant viscoelastomeric material has a foam-like appearance. These microspheres can be made from materials such as glass and polymers.

Glass microspheres, as described in U.S. Pat. No. 4,223,067, can have an average diameter of from about 5 to 200 pm, preferably from about 20 to about 80 $\mu$m. Such microspheres can comprise from 5 to 65% (by vol.) of the viscoelastomeric material of the present invention. Preferably, a coated layer of the viscoelastomeric material is at least three times as thick, preferably at least seven times thick, as the diameter of the glass microspheres.

Alternatively, hollow polymeric microspheres having average diameters of from 5 to 200 $\mu$m are blended into the syrup of the present invention in amounts of from about 15 to about 75% (by vol.) prior to coating. Where such polymeric microspheres are used, they can be added into the syrup in an unexpanded form and subsequently heated to cause expansion. However, expanding them prior to addition is generally preferred because this helps to ensure that the hollow microspheres are substantially surrounded by at least a thin layer of viscoelastomeric material in the final article. Useful polymeric microspheres are described in U.S. Pat. Nos. 3,615,972, 4,075,238, and 4,287,308. Hollow polymeric microspheres are available under the tradename Expancel™ (Eka Nobel Inc.; Marietta, Ga.). In expanded form, they have a specific density of approximately 0.02 to 0.036 g/cm$^3$.

A particularly useful adjuvant is fumed silica, especially hydrophobic silica as disclosed in U.S. Pat. Nos. 4,710,536 and 4,749,590. In another embodiment of the present invention, a layer of the viscoelastomeric material can contain from about 2 to about 15 pbw of hydrophobic silica having a surface area of at least 10 m$^2$/g.

Other useful adjuvants that can be blended into the syrup of the present invention include fillers, dyes, pigments, plasticizers, fibrous reinforcing agents, woven and non-woven fabrics, foaming agents, antioxidants, stabilizers, fire retardants, tackifiers, electrically conductive particles, and viscosity adjusting agents. For some applications, the use of chain transfer agents might be desirable to keep the molecular weight of the solute polymer below a desired value. The amount of such adjuvants can vary from about 0.1 to 50% (by wt.), depending on the desired end use.

Although viscoelastomeric films can be prepared directly from the solvent monomer mixture (by quickly polymerizing a coated layer of the monomer to a polymer-monomer mixture), increasing the viscosity to a level more suitable for coating is preferred. This is readily accomplished by exposing the monomer(s) to a source of energy until about 0.1 to 15% (by wt.), preferably about 0.1 to 10% (by wt.), more preferably about 3 to 7% (by wt.), of the monomers have polymerized. If the source of energy is heat, a heat-activated initiator of free radicals can be included in the composition. If the source of energy is UV radiation, a radiation-activated source of free radicals can be used (but is not required where the C monomer contains a radiation-sensitive group that produces free radicals on exposure to suitable radiation). Use of a radiation-activated source of free radicals is preferred in such situations, however.

The composition (i.e., syrup) of the present invention is preferably prepared in situ by mixing one or more free radically-polymerizable ethylenically unsaturated monomers and 0 to 5 pbw of one or more of the above-described C monomers and then polymerizing the monomer(s) to form a solute polymer. The monomers can be added in any order. Where no C monomer is present in the monomer mixture from which the syrup is formed (i.e., no radiation-sensitive α-cleaving groups are present in either the solute polymer or the solvent monomer mixture), some of these groups must be introduced into the syrup prior to formation of the viscoelastomeric material. This can be done by adding C monomer to the syrup after formation of the solute polymer or by adding to the syrup a second polymer (made separately from the syrup) that contains mer units with the above-described radiation-sensitive α-cleaving groups pendent therefrom. Adjuvants, when desired, can thereafter be blended into the mixture.

The in situ preparation of the composition just described allows for the production and solubilization of very high molecular weight polymers. Such polymers preferably have a molecular weight of at least 500,000, more preferably at least 750,000, even more preferably at least 1,000,000, most preferably at least 1,500,000. The solubilization of a separately made polymer of such a high molecular weight is very difficult. Therefore, the above-described in situ preparation method is the preferred manner of making the composition of the present invention.

A syrup of a coatable viscosity can be applied to a substrate, preferably a flexible carrier web, using any conventional coating means such as roller coating, dip coating, knife coating, and extrusion coating. The substrate can further comprise a release coating between the substrate and the syrup or on the side of the substrate opposite the side on which the syrup is coated.

Once a syrup has been prepared, a crosslinked viscoelastomeric material can be prepared therefrom in a variety of ways. In each method, the remaining monomer(s) in the syrup are polymerized by exposure to radiation that activates the α-cleaving groups and facilitates polymerization. However, this process can be carried out in a variety of ways.

One way to make the viscoelastomeric material from the remaining monomer(s) is to irradiate the syrup with both high and low intensity UV radiation. Low intensity radiation is defined as 10 mW/cm$^2$ or less (as measured in accordance with procedures approved by the United States National Institute of Standards and Technology as, for example, with a UVIMAP∩ UM 365 L-S radiometer manufactured by Electronic Instrumentation & Technology, Inc., in Sterling, Va.), preferably in the wavelength region of 200 to 600 nm, more preferably 280 to 400 nm. High intensity radiation is defined as anything greater than 10 mW/cm$^2$, preferably between 15 and 450 mW/cm$^2$. When such radiation is used, the viscoelastomeric material is formed directly from the syrup.

Other ways of making the viscoelastomeric material involve initially exposing the syrup to only low intensity radiation. Syrup formulations that produce high performance viscoelastomeric materials will depend on the particular crosslinker (i.e., C monomer) and its ability to be activated by the particular radiation used. Generally, where the percentage (by wt.) of mer units derived from the C monomer(s) is about 0.4% or greater and no polyethylenically unsaturated monomer is present and curing is performed in an environment that is substantially free of oxygen, this low intensity exposure is sufficient to make a viscoelastomeric material that is a PSA with balanced properties. Where curing occurs between radiation transparent release liners, the amount of C monomer(s) can be about 0.04% (by wt.) and, yet, a viscoelastomeric material with balanced PSA properties can be obtained. Where the percentage (by wt.) of mer units derived from the C monomer (s) is less than about 0.4%, however, further processing is preferable. Specifically, exposure to low intensity light followed by exposure to high intensity radiation can produce a crosslinked viscoelastomeric material with balanced PSA properties. About 0.05% (by wt.) of a multifunctional acrylate (e.g., hexanediol diacrylate) is preferably added to the syrup to aid in the formation of the viscoelastomeric material.

Polymerization is preferably performed in an inert (i.e., oxygen free) atmosphere, such as a nitrogen atmosphere. Tolerance to oxygen can be increased by including in the syrup an oxidizable tin compound, as is taught in U.S. Pat. No. 4,303,485, the teaching of which is incorporated herein by reference.

The syrup of the present invention can be cured in air by covering a layer of the photoactive coating with a plastic film that is substantially transparent to UV radiation but impervious to oxygen and irradiating the composition through that film using UV lamps that emit light in the wavelength range corresponding to the absorption maximum of any saturated photoinitiator used. Several different commercially available lamps, including medium pressure mercury lamps and low-intensity fluorescent lamps, can be used. The radiation intensity of these lamps is preferably adjusted so that the radiation intensity at the surface of the coating is less than 20 mW/cm$^2$, preferably 0.5 to 6 mW/cm$^2$, each having emission maxima between 200 and 600 nm, preferably between 280 and 400 nm. Maximum efficiency and rate of polymerization is dictated by the relationship between emission properties of the radiation source and the absorption properties of the photoactive compounds employed.

Where the saturated energy-activated initiator in the syrup of the present invention is heat-activated, the syrup preferably is exposed to a heat source either before or simultaneously with exposure to radiation of a wavelength that activates the α-cleaving groups present in the monomer and/or the polymer of the syrup.

Where saturated the energy-activated initiator in the syrup of the present invention is a UV radiation-activated initiator, the syrup preferably is exposed first to a wavelength of radiation that activates the saturated initiator until the monomers polymerize to a coatable viscosity so that the syrup can be coated on a substrate. This coated composition is exposed to radiation of a wavelength to which the α-cleaving group of the C monomer is sensitive at an intensity of less than 10 mW/cm$^2$ (for a total dose of 30 to 800 mJ/cm$^2$) so as to further polymerize the monomers as well as crosslink the polymer chains. The wavelengths used to activate the saturated initiator and the α-cleaving group can be the same as long as the wavelength is one at which the saturated initiator is more sensitive than the α-cleaving group. For example, a composition comprising PIA #2 (which has an absorption spectrum with an absorption maximum at a wavelength of about 300 nm) as the C monomer and 2,2-dimethoxy-2-phenyl-1-phenylethanone (which is activated by radiation having a wavelength maximum at about 350 nm) as the saturated initiator.

Extent of polymerization can be monitored by measuring the refractive index of the adhesive layer. Refractive index is a sensitive measure of the extent of polymerization. This method is commonly applied in polymerization kinetics work. See, for example, discussions about the method in *Polymerization at Advanced Degrees of Conversion*, G. P. Gladyshev and K. M. Gibov, Keter Press, Jerusalem (1970). Change in refractive index occurs linearly with conversion of (meth)acrylate unsaturation.

Where the crosslinked viscoelastomeric material of the present invention is a PSA, it displays balanced PSA properties (i.e., a good combination of adhesion, cohesion, stretchiness, and elasticity). This is believed to result from the crosslinked nature of the viscoelastomeric material. Crosslinking in the present invention is quite different from the conventional mechanism of crosslinking provided by diacrylates where a similar increase in concentration of diacrylates results in a concomitant reduction in peel adhesion strength without an increase in static shear strength.

A multilayered tape that includes at least one cured layer derived from the syrup of the present invention is also within the scope of the present invention. Such tapes can have a thin layer of a different PSA laminated thereto, so that the adhesive of the invention is being used as a backing or core layer. The additional layer(s) can be any conventional adhesive known in the art; however, (meth)acrylic adhesives are preferred. Such multilayered constructions can be prepared by processes disclosed in U.S. Pat. Nos. 4,818,610, 4,894,259, and 4,895,738, the teachings of which are incorporated herein by reference. More preferably, additional adhesive layers include polymers of at least one alkyl (meth)acrylate monomer and a copolymerizable monomer hompolymerizable to a polymer with a $T_g$ above about 50° C.

Multilayered tapes where a layer of a polyurethane, polychloroprene, polyacrylic foam, or polyethylene foam on which is coated a layer of the viscoelastomeric material of the present invention are also possible. Such tapes are often used to attain very high bond strengths. Further information about such constructions can be found in, for example, U.S. Pat. Nos. 3,565,247, 3,993,833, and 4,415,615, the teachings of which are incorporated herein by reference.

When the coated films of the present invention are cured, they preferably have a percent gel (corrected for any soluble tackifying resins and other additives) in the range of from 2 to 95% (by wt.), more preferably from 30 to 90% (by wt.), and most preferably from 50 to 80% (by wt.).

The compositions of the present invention can also be used to make a cellular PSA membrane as is described in U.S. Pat. No. 4,415,615, the teaching of which is incorporated herein by reference.

Objects and advantages of this invention are further illustrated by the following examples. The particular materials and amounts thereof, as well as other conditions and details, recited in these examples should not be used to unduly limit this invention.

EXAMPLES

A. Static Shear Value

The adhesive films described in the examples were cut into strips 1.27 cm in width. One of the release liners was removed and the strip was placed, with the adhesive side down, onto a piece of aluminum foil 125 µm thick and 1.6 cm wide. The remaining release liner film was removed from each of the strips to form a "test adhesive tape" and adhered by its adhesive to a flat, rigid stainless steel plate with exactly 1.27 cm length of tape in contact with the plate. Before testing, a 1000 g weight at 25° C. was placed over the bonded area for about 15 minutes. The plate with the adhered tape was placed either at room temperature (RT) or in an air-circulating oven which had been preheated to 70° C. A weight was hung from the free end of the tape, with the panel tilted 2° from vertical to eliminate any peel forces. The time (in minutes) at which the weight fell was designated the static shear RT (1000 g) or 70° C. (500 g). The test was discontinued after 10,000 minutes if no failure occurred and the result given as "10,000+".

B. Peel Strength

Each measurement was made using a 90° peel mode at 30.5 cm/min. In the Examples below, results are reported in N/dm.

Pieces of stainless steel were washed once with acetone and three times with a 50:50 water-isopropanol solution. Each adhesive film was adhered to a stainless steel backing for three days prior to being tested. Each sample was about 1.3 cm wide and had a 0.13 mm anodized aluminum backing (about 1.6 cm wide).

Examples 1–5

A number of compositions including the following components were prepared:

90 pbw isooctyl acrylate (prepared according to processes available in the literature)

10 pbw acrylic acid 0.04 pbw 2,2-dimethoxy-2-phenyl-1-phenylethanone (Ciba Geigy).

To each mixture was added the amount of PIA #2 (available as ZLI 3331 from Ciba-Geigy), shown in Table II. Each mixture was degassed in a vacuum desiccator. The degassed mixture was partially polymerized by exposure for about 10 seconds to Sylvania™ F15T8/350 BL 15-watt fluorescent black lamps. The resulting syrup was knife coated onto a 50 µm biaxially-oriented poly(ethylene terephthalate) (PET) film at a thickness of 125 mm for Examples 1 to 5. The coated films were passed through a coating device maintained under $N_2$. The films were exposed to radiation from black lamps having a peak output at 350 nm and an intensity of 4.0 mW/cm². Each coated tape was aged 72 hours at 25° C. and 50% relative humidity. Measured peel adhesion and shear strengths and are listed in Table II.

TABLE II

| | | Peel Adhesion (N/dm) | | Shear Strength (min) | |
|---|---|---|---|---|---|
| Ex. No. | Wt. % PIA #2 | Stainless Steel | Polypropylene | 25° C., 1 kg load | 70° C., 0.5 kg load |
| 1 | 0.0 | 181.5 | 71.5 | 366 | 366 |
| 2 | 0.1 | 163.3 | 71.8 | 612 | 34 |
| 3 | 0.2 | 185.7 | 52.8 | 7440 | 199 |
| 4 | 0.3 | 177.3 | 58.9 | 10,000+ | 5399 |
| 5 | 0.4 | 154.5 | 57.5 | 10,000+ | 10,000+ |

Those skilled in the art will readily observe that the concentration of C monomer (i.e., PIA #2) over the range from 0 to 0.4% (by wt.) has very little effect on the peel adhesion of the tapes (i.e., the peel adhesion remained within 154 to 186 N/dm for stainless steel and 52 to 72 N/dm for polypropylene). A concentration of C monomer of 0.2% (by wt.) or more in the adhesive is helpful in obtaining shear strengths of more than 5000 minutes at room temperature, and 0.3% (by wt.) or more is helpful in obtaining shear strengths of more than 5000 minutes at 70° C.

Examples 6–9

Syrups were prepared as described in Examples 1 to 5 using mixtures of monomers as shown in Table III. (In Example 9, the monomer mixture also included a polystyrene macromer with a number average molecular weight of about 13,000.) The weight percentage of 2,2-dimethoxy-2-phenyl-1-phenylethanone and PIA #2 used in each syrup was 0.04%.

The syrups of Examples 6 and 7 were coated at a thickness of 250 µm and those of Examples 8 and 9 at 125 µm. A 25 µm thick release-coated sheet of PET was laminated to the syrup-coated side of each tape, and the laminate exposed to radiation as described in Examples 1 to 5. Each PSA tape was then aged for 72 hours at 25° C. and a relative humidity of 50%. The peel adhesion and shear strength of each is shown in Table III.

TABLE III

| Ex. No. | Amounts of monomer (pbw) | | | Peel Adhesion (N/dm) | | Shear Strength (min), 25 mm × 125 mm | |
|---|---|---|---|---|---|---|---|
| | IOA | AA | Poly-styrene | Stainless steel | Poly(acrylo-nitrilebutadiene-styrene) | 25° C., 1 kg load | 70° C., 0.5 kg load |
| 6 | 95 | 5 | 0 | 65.5 | 133.0 | 10,000+ | 10,000+ |
| 7 | 90 | 10 | 0 | 177.4 | 142.1 | 10,000+ | 10,000+ |
| 8 | 80 | 20 | 0 | 131.2 | 45.9 | 10,000+ | 10,000+ |
| 9 | 90 | 10 | 4 | 139.7 | 59.9 | 10,000+ | 10,000+ |

Example 10

To a series of glass jars purged with nitrogen were added 90 pbw IOA, 10 pbw AA, 0.04 pph 2,2-dimethoxy-2-phenyl-1-phenylethanone, and varying amounts of PIA #2. Each mixture was exposed to low intensity UV radiation so as to partially polymerize the monomers to a coatable viscosity. An additional 0.16 pph 2,2-dimethoxy-2-phenyl-1-phenylethanone was added after the syrup was made. Varying amounts of HDDA were also added to the syrup.

The mixtures were cured on a solvent-free silicone paper release liner at a thickness of 0.13 mm. The samples were exposed to low intensity radiation for 145 seconds, the first third of the time at an intensity of 1.9 mW/cm$^2$ and the remainder of the time at an intensity of 4.2 mW/cm$^2$. The oxygen level was 250±20 ppm. The samples were exposed to high intensity radiation at an average intensity of 112 mW/cm$^2$ for about five seconds. The conversion of all the polymers was greater than 98%.

Peel strength values were determined after the peel samples were adhered to the stainless steel substrates for three days.

Static shear strength values were measured using stainless steel substrates cleaned once with acetone and three times with a 50:50 isopropanol/water mixture. 2.54 cm×1.27 cm samples were prepared and a 1000 g load was used at room temperature and a 500 g load was used at 70° C. The shear samples were adhered to stainless steel for four hours prior to hanging. (0.13 mm anodized aluminum backings were used for all of the samples.) The time until failure is the average of two samples (in minutes).

TABLE IV

| Ex. No. | Amt. of PIA (pph) | Amt. of HDDA (pph) | Shear Strength (min) | | Peel Strength (N/dm) |
|---|---|---|---|---|---|
| | | | RT | 70° C. | |
| C1 | 0 | 0.1 | 10,000+ | 141 | 203 |
| C2 | 0.028 | 0.05 | 10,000+ | 265 | 200 |
| 10 | 0.125 | 0.05 | 10,000+ | 10,000+ | 196 |

Example C1 shows that, when using HDDA by itself, balanced properties (i.e., a PSA with high room temperature shear, high 70° C. shear, and high peel strength) are not obtained. Example C2 shows that too low of a loading level of PIA, when used with HDDA, also does not provide balanced static shear strength properties. However, at loading levels of about 0.1 pph of PIA used in combination with high intensity radiation and about 0.05 pph HDDA, balanced shear properties can be achieved.

Various modifications and alterations that do not depart from the scope and spirit of this invention will become apparent to those skilled in the art. This invention is not to be unduly limited to the illustrative embodiments set forth therein.

We claim:

1. A syrup curable to a crosslinked viscoelastomeric adhesive comprising:

a) about 85 to 99.9 weight percent of a solvent monomer mixture comprising
      1) 95 to 100 parts by weight of at least one free radically-polymerizable ethylenically unsaturated monomer, and
      2) an ethylenically unsaturated monomer in an amount up to 5 parts by weight and comprising a radiation-sensitive α-cleaving group;

b) about 0.1 to 15 weight percent of a solute polymer prepared in situ from said monomer mixture;

c) from 0 to 5 parts by weight of a free radically-polymerizable polyethylenically unsaturated monomer; and d) from 0 to 3 parts by weight of a saturated energy-activated initiator of polymerization.

2. The syrup of claim 1 wherein said at least one free radically-polymerizable ethylenically unsaturated monomer of said monomer mixture comprises a monoethylenically unsaturated monomer homopolymerizable to a polymer having a glass transition temperature of less than about 0° C.

3. The syrup of claim 2 wherein said monoethylenically unsaturated monomer is selected from the group consisting of isooctyl acrylate, 2-ethylhexyl acrylate, isononyl acrylate, decyl acrylate, dodecyl acrylate, hexyl acrylate, and butyl acrylate.

4. The syrup of claim 2 wherein said at least one free radically-polymerizable ethylenically unsaturated monomer further comprises a monoethylenically unsaturated monomer homopolymerizable to a polymer having a glass transition temperature of greater than about 50° C.

5. The syrup of claim 4 wherein said second monoethylenically unsaturated monomer is selected from the group consisting of (meth)acrylic acid, itaconic acid, N,N-dimethylacrylamide, N-octylacrylamide, 2-hydroxyethyl acrylate, N-vinyl pyrrolidone, N-vinyl caprolactam, acrylonitrile, tetrahydrofurfuryl acrylate, and isobornyl acrylate.

6. The syrup of claim 1 wherein said ethylenically unsaturated monomer comprising a radiation sensitive group has the formula

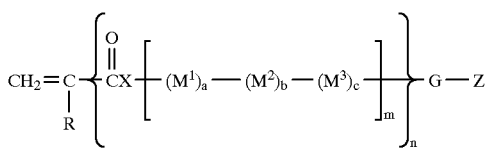

wherein

R is H or a $C_1$ to $C_3$ alkyl group, preferably H or a methyl group;

X is O or NH;

n is 0 or 1;

m is 0 or an integer from 1 to 5;

a, b, and c are independently 0 or 1;

$M^1$ is $CH_2$ or $SiR^1R^2$;

$M^2$ is $CR^3R^4$ or $SiR^1R^2$;

$M^3$ is O, NH, C(O), C(O)O, C(O)NH, or OC(O)NH;

$R^1$ and $R^2$ are independently H or a $C_1$ to $C_4$ alkyl group;

$R^3$ and $R^4$ are independently H, an alkyl group having 1 to 14 carbon atoms, a cycloalkyl group having 3 to 14 carbon atoms, an aryl group having 5 to 12 ring atoms, an arenyl group having 6 to 26 carbon and 0 to 3 S, N, and nonperoxidic O heteroatoms, or $R^3$ and $R^4$ taken together with the carbon to which they are attached form a carbocyclic ring containing 4 to 12 ring atoms;

G is a covalent bond, $(CH_2)_d$, or $(CH_2)_dO$ where d is an integer from 1 to 4, preferably from 1 to 2;

Z is a radiation-sensitive α-cleaving group having the general formula

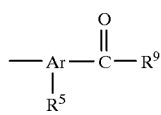

in which

Ar is an arene group having 6 to 12 carbon atoms and substituted by $R^5$;

$R^5$ is hydrogen, a $C_1$ to $C_{12}$ alkyl group, a $C_1$ to $C_{12}$ alkoxy group, or a phenyl group; and $R^9$ is selected from the group consisting of

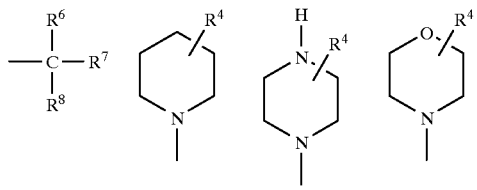

in which $R^4$ is selected from the class consisting of hydrogen, $C_1$ to $C_{12}$ alkyl groups, $C_1$ to $C_{12}$ alkoxy groups, and phenyl groups, with the proviso that, when $R^3$ and $R^5$ are both ortho to the carbonyl group of Z, together they can be one of

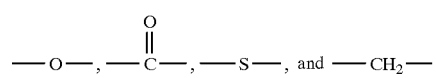

and $R^6$, $R^7$, and $R^8$ are independently selected from the class consisting of hydroxyl, phenyl, $C_1$ to $C_{12}$ alkyl, $C_1$ to $C_6$ alkoxy, and $-NR^{10}R^{11}$ groups, wherein $R^{10}$ and $R^{11}$ are independently hydrogen or a $C_1$ to $C_6$ alkyl group, with the proviso that, when $R^9$ is $-CR^6R^7R^8$, one of the following must be true:

(1) at least one of $R^6$, $R^7$, and $R^8$ is selected from the class consisting of hydroxyl, alkoxy, and $-NR^{10}R^{11}$;

(2) any two of $R^6$, $R^7$, and $R^8$ together are one of $-C_pH_{2p}-$ and $-OC_pH_{2p}O-$ wherein p is either 2 or 3 so that they, together with the carbon atoms to which they are attached, form a 5- or 6-membered ring; and (3) any two of $R^6$, $R^7$, and $R^8$ together are a carbonyl group, provided that the remaining one of $R^6$, $R^7$, and $R^8$ is selected from the class consisting of hydroxy, alkoxy, $-NR^{10}R^{11}$, and phenyl groups.

7. The syrup of claim 6 wherein $R^9$ of said ethylenically unsaturated monomer comprising a radiation-sensitive group is

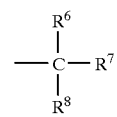

8. The syrup of claim 6 wherein X is O, m is 0, and G is $(CH_2)_dO$ with d being 2.

9. The syrup of claim 6 wherein Ar of said ethylenically unsaturated monomer comprising a radiation-sensitive α-cleaving group is a benzene group.

10. The syrup of claim 1 wherein said saturated energy-activated initiator of polymerization is present in an amount of 0.001 to 1.0 parts by weight.

11. The syrup of claim 1 wherein said solute polymer has a molecular weight of at least 500,000.

12. The syrup of claim 10 wherein said energy is ultraviolet radiation.

13. The syrup of claim 1 wherein said syrup is of a coatable viscosity.

14. A process for making a viscoelastomeric adhesive comprising the steps:

a) providing a composition comprising
 1) a solvent monomer mixture comprising
  (a) at least one free radically-polymerizable ethylenically unsaturated monomer, and
  (b) an ethylenically unsaturated monomer in an amount up to 5 parts by weight and comprising a radiation-sensitive α-cleaving group, and
 2) 0 to 3 parts by weight of a saturated energy-activated initiator of polymerization;

b) exposing said composition to energy so as to partially polymerize said monomer mixture to form a coatable adhesive syrup;

c) adding to said syrup, based on the total amount of monomer initially present in said monomer mixture,
 1) 0 to 3 parts by weight of a saturated energy-activated initiator of polymerization,
 2) 0 to 3 parts by weight of an ethylenically unsaturated monomer comprising a radiation-sensitive α-cleaving group, with the proviso that the amount of ethylenically unsaturated monomer comprising a radiation-sensitive α-cleaving group added to said syrup must be greater than zero when the amount of said ethylenically unsaturated monomer comprising a radiation-sensitive α-cleaving group in said monomer mixture is zero, and 3) 0 to 5 parts by weight of a free radically-polymerizable polyethylenically unsaturated monomer; and d) exposing said syrup to energy that activates said saturated initiator and said radiation-sensitive α-cleaving group of said ethylenically unsaturated monomer comprising a radiation-sensitive α-cleaving group so as to form said viscoelastomeric adhesive.

15. The process of claim 14 wherein said ethylenically unsaturated monomer comprising a radiation-sensitive α-cleaving group has the formula $$CH_2=C\left\{\begin{matrix}O\\\|\\CX\end{matrix}\left[(M^1)_a-(M^2)_b-(M^3)_c\right]_m\right\}_n G-Z$$
$$\hspace{1em} |$$
$$\hspace{1em} R$$

wherein

R is H or a $C_1$ to $C_3$ alkyl group, preferably H or a methyl group;

X is O or NH;

n is 0 or 1;

m is 0 or an integer from 1 to 5;

a, b, and c are independently 0 or 1;

$M^1$ is $CH_2$ or $SiR^1R^2$;

$M^2$ is $CR^3R^4$ or $SiR^1R^2$;

$M^3$ is O, NH, C(O), C(O)O, C(O)NH, or OC(O)NH;

$R^1$ and $R^2$ are independently H or a $C_1$ to $C_4$ alkyl group;

$R^3$ and $R^4$ are independently H, an alkyl group having 1 to 14 carbon atoms, a cycloalkyl group having 3 to 14 carbon atoms, an aryl group having 5 to 12 ring atoms, an arenyl group having 6 to 26 carbon and 0 to 3 S, N, and nonperoxidic O heteroatoms, or $R^3$ and $R^4$ taken together with the carbon to which they are attached form a carbocyclic ring containing 4 to 12 ring atoms;

G is a covalent bond, $(CH_2)_d$, or $(CH_2)_dO$ where d is an integer from 1 to 4, preferably from 1 to 2;

Z is a radiation-sensitive α-cleaving group having the general formula $$-Ar-\overset{\overset{O}{\|}}{\underset{\underset{R^5}{|}}{C}}-R^9$$

in which

Ar is an arene group having 6 to 12 carbon atoms and substituted by $R^5$;

$R^5$ is hydrogen, a $C_1$ to $C_{12}$ alkyl group, a $C_1$ to $C_{12}$ alkoxy group, or a phenyl group; and $R^9$ is selected from the group consisting of $$-\underset{\underset{R^8}{|}}{\overset{\overset{R^6}{|}}{C}}-R^7 \quad\quad \text{(piperidine)} \quad\quad \text{(piperazine)} \quad\quad \text{(morpholine)}$$

in which $R^4$ is selected from the class consisting or hydrogen, $C_1$ to $C_{12}$ alkyl groups, $C_1$ to $C_{12}$ alkoxy groups, and phenyl groups, with the proviso that, when $R^3$ and $R^5$ are both ortho to the carbonyl group of Z, together they can be one of $$-O-,\quad -\overset{\overset{O}{\|}}{C}-,\quad -S-, \text{ and } -CH_2-$$

and $R^6$, $R^7$, and $R^8$ are independently selected from the class consisting of hydroxyl, phenyl, $C_1$ to $C_2$ alkyl, $C_1$ to $C_6$ alkoxy, and $-NR^{10}R^{11}$ groups, wherein $R^{10}$ and $R^{11}$ are independently hydrogen or a $C_1$ to $C_6$ alkyl group, with the proviso that, when $R^9$ is $-CR^6R^7R^8$, one of the following must be true:

(1) at least one of $R^6$, $R^7$, and $R^8$ is selected from the class consisting of hydroxyl, alkoxy, and $-NR^{10}R^{11}$;

(2) any two of $R^6$, $R^7$, and $R^8$ together are one of $-C_pH_{2p}-$ and $-OC_pH_{2p}O-$ wherein p is either 2 or 3 so that they, together with the carbon atoms to which they are attached, form a 5- or 6-membered ring; and (3) any two of $R^6$, $R^7$, and $R^8$ together are a carbonyl group, provided that the remaining one of $R^6$, $R^7$, and $R^8$ is selected from the class consisting of hydroxy, alkoxy, $-NR^{10}R^{11}$, and phenyl groups.

16. The process of claim 14 wherein said step of exposing said composition to energy forms a coatable syrup containing a solute polymer having a molecular weight of at least 500,000.

17. The process of claim 15 further comprising the step:

e) prior to irradiating said syrup, coating said syrup on a substrate.

18. The process of claim 17 wherein said substrate is a flexible web.

* * * * *